United States Patent [19]

Mueller

[11] Patent Number: 5,483,230
[45] Date of Patent: Jan. 9, 1996

[54] BUS SYSTEM

[75] Inventor: Karl Mueller, Rottweil-Neufra, Germany

[73] Assignee: Marquardt GmbH, Rietheim-Weilheim, Germany

[21] Appl. No.: 139,741

[22] Filed: Oct. 22, 1993

[30] Foreign Application Priority Data

| Oct. 23, 1992 | [DE] | Germany | 42 35 775.6 |
| Nov. 9, 1992 | [DE] | Germany | 42 37 789.7 |
| Jul. 3, 1993 | [DE] | Germany | 43 22 249.8 |

[51] Int. Cl.$^6$ .................................................. H04Q 1/18
[52] U.S. Cl. ........................... 340/825.06; 340/825.07; 340/870.11; 370/85.9; 370/85.11
[58] Field of Search .................. 340/825.07, 825.06, 340/825.52, 870.11, 827.13; 370/85.11, 85.9

[56] References Cited

U.S. PATENT DOCUMENTS

| 4,652,853 | 3/1987 | Tagami et al. | 340/825.06 |
| 5,157,658 | 10/1992 | Arai et al. | 340/825.07 |
| 5,289,365 | 2/1994 | Caldwell et al. | 340/825.07 |

FOREIGN PATENT DOCUMENTS

| 277302 | 8/1988 | European Pat. Off. . |
| 0511851A2 | 11/1992 | European Pat. Off. . |
| 2658753 | 6/1978 | Germany . |
| 3150313 | 3/1985 | Germany . |
| 3429941C2 | 5/1985 | Germany . |
| 3609487 | 10/1986 | Germany . |
| 3503306 | 3/1987 | Germany . |
| 3627638 | 3/1987 | Germany . |
| 3615954 | 11/1987 | Germany . |
| 3717886 | 12/1988 | Germany . |
| 3730468A1 | 3/1989 | Germany . |
| 3743847A1 | 7/1989 | Germany . |
| 3709013 | 6/1990 | Germany . |
| 3802254 | 11/1990 | Germany . |

(List continued on next page.)

OTHER PUBLICATIONS

Can products for universal fields of application; Jan. 1992 pp. 2–15.
N. N.: Trend zur Dezentralisierung. In: Elektronik, Nov. 1992, p. 50.
Etschberger, Konrad ete al.: CAN–Netzwerke in Verteilten Steuerungssystemen. In: Elektronik 26/1991, pp. 42–48.
Lawrenz, Wolfhard: CAN—ein Auto–Bus. In: m&p, Jun. 1992; pp. 46–53.
Wolff, Hans–Wilhelm: Von CAN bis ABS. In: Design & Elektronik 23 v. Nov. 3, 1992, pp. 96–97.
Neumann, "Automatisierungsgeräte in der technischen Gebäudeausrüstung", elektrowärme international 49 (1989) A 5 Sep., pp. A 180–A 184.

*Primary Examiner*—Michael Horabik
*Attorney, Agent, or Firm*—Spencer, Frank & Schneider

[57] ABSTRACT

A bus system for sensor modules includes at least one bus for interconnecting the sensor modules and for carrying signals between the sensor modules. Switching control devices are provided, a first one being a bus master device for the at least one bus having bus logic control for controlling the transmission of signals over the at least one bus. A superordinate main bus is provided for connecting the switching control devices together and for transmitting signals between the switching control devices. The at least one bus is connected with the superordinate main bus by the bus master. Binary switching signals transmitted over the at least one bus are detected by the sensor modules, and/or processed by the sensor modules. The sensor modules contain integrated bus logic for converting the binary switching signals into bus signals and vice versa. The at least one bus has a single common data line to which the sensor modules are connected for serial data transmission. The at least one bus operates bidirectionally in transmitting and receiving directions during half-duplex operation. The single common data line is driven by the bus master device independently of the superordinate main bus. The bus logic control in the bus master device controls the timing of data transmission in both transmitting and receiving directions. The at least one bus also provides a supply voltage to the sensor modules.

24 Claims, 6 Drawing Sheets

FOREIGN PATENT DOCUMENTS

| | | |
|---|---|---|
| 3921744 | 1/1991 | Germany . |
| 4029290 | 3/1991 | Germany . |
| 4039005A1 | 6/1991 | Germany . |
| 400453A1 | 8/1991 | Germany . |
| 4020809 | 1/1992 | Germany . |
| 4106726A1 | 9/1992 | Germany . |
| 4123828C1 | 12/1992 | Germany . |
| 2-116242 | 7/1990 | Japan . |
| 2-182057 | 9/1990 | Japan . |

5,483,230

BUS SYSTEM

BACKGROUND OF THE INVENTION

1. Field of the Invention

The invention relates to a bus system.

1. Background Information

Electronics is being used to an increasing extent in all fields of modern technology. This also applies in particular to modern automobile technology with a constant increase in electrical components, motors and assemblies as well as electronic systems which have to be actuated at least partially by means of switches and control elements. This applies for example to the body system with lights, central locking, door securing elements, window lifters, rear view mirror adjustment, heating and air-conditioning system, adjustment of seat belts and seats etc. Since the switches or control elements have to be arranged in the region of the user and thus usually at a distance from the respective electronic system, extensive wiring of the respective switches and control elements is required. Often more than 100 cables and plug-in connections for connecting such switches and control elements have to be accommodated in the region of the dashboard of a modern motor vehicle alone. An additional factor is that modern vehicle safety systems, such as for example brake monitoring, anti-lock system, traction slip control etc., and electronic engine and transmission control require complex sensor systems which also have to be wired up. Thus, such conventional wiring has developed to an extent which is hardly manageable any more.

Due to this wiring which is constantly becoming more extensive, the problems which occur as a result of electromagnetic interference radiations of the conventional wiring lines and vice versa as a result of interference signals being picked up in the wiring lines are constantly increasing.

In order to remedy this, it has become known in vehicle manufacture to realize a network of electronic control devices by means of a bus system, as a result of which as many electronic control systems or control devices as desired can be connected together in the motor vehicle by means of a common bus and can exchange data. A bus system of this kind is for example the known CAN bus (CAN=Controller Area Network). It is disadvantageous here that this solution involves a very complex and cost-intensive connection of the control systems and devices to the bus system which is completely over-dimensioned for the majority of control elements located in the motor vehicle. In addition, special, and thus expensive, control devices for this bus system are required.

It is also known from computer technology to connect a bus to a superordinate main bus. Thus, the German Offenlegungsschrift 37 43 847 shows the connection of a plurality of sensor modules, serving to detect measurement variables, to a measurement bus, the bus being a parallel microprocessor bus, the sensor modules being connected to a central computer and being addressed by the central computer by means of an address. A plurality of these central computers communicate in turn with a superordinate host computer via its own main bus, by which means a flexible process measurement data detection and processing system is to be provided.

However, it is disadvantageous that this is also a complex system which is specially adapted to the functions of the process data processing. A system of this kind is also overdimensioned for the demands made on the majority of control elements in the motor vehicle and cannot be used cost effectively. In particular, the system is not suitable for connecting into a bus system sensors, actuators and mechanical switches which are organized in binary fashion.

SUMMARY OF THE INVENTION

The invention is based on the object of configuring a bus system in such a way that a simple and cost-effective connection of sensor modules, such as control elements in a motor vehicle, is made possible. In particular, connection of sensors, actuators and mechanical switches, which are organized in binary fashion, into a bus system with its own autonomous control by means of a bus master device is to be made possible. If a superordinate main bus is present, connection of the bus system to the main bus by means of open interfaces via the bus master device is also to be made possible.

This object is achieved in a bus system of the generic type by means of the characterizing features described below.

The advantages which are achieved with the invention consist in particular in the fact that, in comparison with known bus systems, a very simple and also flexible system for connecting sensor modules to a network is effected. At the same time, a plurality of individual switches, even conventional mechanical switches, can be used as sensor modules. The connection of such switches is effected directly to the bus so that the binary switching signal of the individual switch can be integrated into the bus system over the shortest path. As a result, long electrical lines as in the conventional construction method are dispensed with. Furthermore, the advantages of the bus networking are utilized to their full extent.

The addressability of the sensor modules connected to one another by means of the bus system, and also the possibility of testing them via the bus, are also advantageous. The bus system according to the invention provides decentralized intelligence without a rise in volume and costs with a minimum degree of expenditure on cabling. Additionally, a large degree of interference suppression of EMC influences takes place.

Finally, the invention also has the advantage that the bus system can be easily integrated into superordinate, commercially available bus systems. Thus, the essential control devices such as the safety-relevant anti-lock system, the brake monitoring, the engine management etc. can be connected via a common, more complex main bus, for example the CAN bus. The elements in the motor vehicle of which less is demanded are made can, on the other hand, be connected by means of the subordinate, more simple and thus more cost effective bus system. Data exchange between the bus system and the superordinate main bus is made possible via open interfaces.

BRIEF DESCRIPTION OF THE DRAWINGS

Exemplary embodiments of the invention are illustrated in the drawings and are described in greater detail below. In the drawings.

DETAILED DESCRIPTION OF THE PREFERRED EMBODIMENTS

The bus system according to the invention is composed of at least one bus for transmitting signals and can be advantageously used in a motor vehicle.

Figure 1:
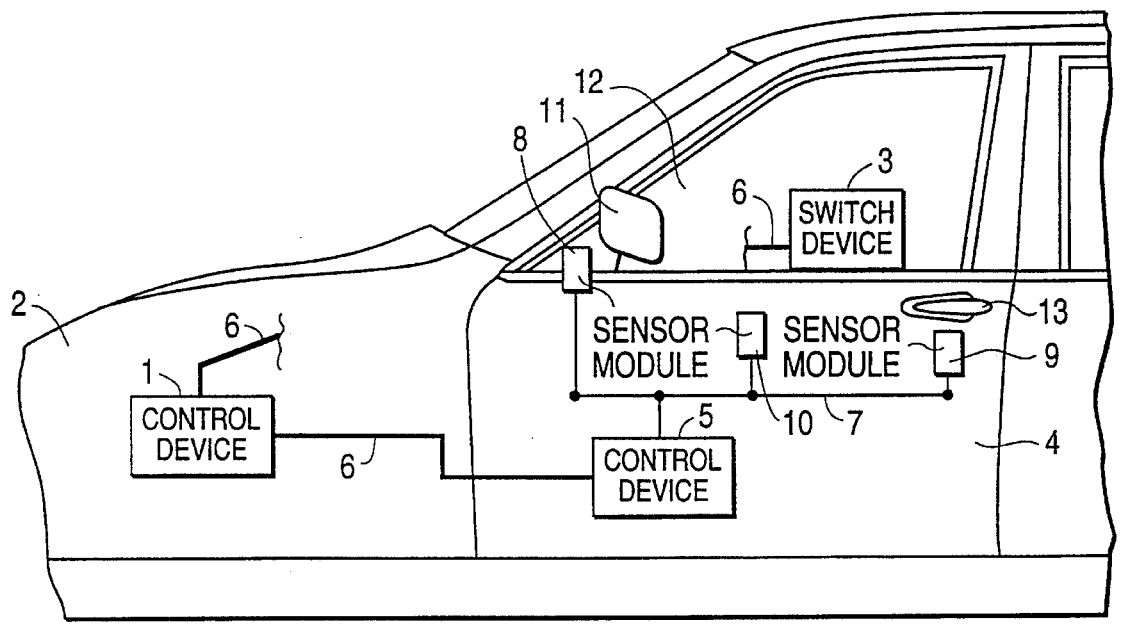
FIG. 1 shows a diagrammatic view of a portion of a body of a motor vehicle with the arrangement of the bus system.

As can be seen more closely in FIG. 1, a control device 1 for the engine electronics is arranged in the engine compartment 2, a switching device 3 for a plurality of control switches for controlling the electrical window lifters and the rear view mirror adjustment are arranged on the inside of the car door 4 or, if appropriate, in the center console and a control device 5 for the rear view mirror adjustment and window lifters is arranged in the car door 4. These switching and control devices 1, 3, 5 are connected to one another via a main bus 6 for the transmission of signals. The main bus 6 can be a CAN bus as described for example in the Philips publication: CAN-Produkte für universelle Anwendungsfelder (CAN products for universal fields of application), January 1992. Of course, a different bus type can equally well be used.

In the car door 4 there is also a bus 7 which produces a connection between a sensor module 8 for the rear view mirror adjustment, a sensor module 9 for the central locking and a sensor module 10 for the electrical window lifters. These sensor modules 8, 9, 10 are located at the rear view mirror 11 and the window 12 for determining the respective limit position of an actuator, and in the door lock 13 for interrogation of the door lock. The control device 5 in the car door 4 is constructed as a bus master device for controlling the signal transmission on the bus 7 so that the signals can be transmitted between the sensor modules 8, 9, 10 and the control device 5. The bus 7 can be controlled independently of the main bus 6 by means of the bus master device 5 and is connected, for signal transmission, to the superordinate main bus 6 via an open interface, i.e. an interface with fixed, disclosed protocol. The entire bus system is illustrated as a basic block circuit diagram in FIG. 2.

Figure 2:
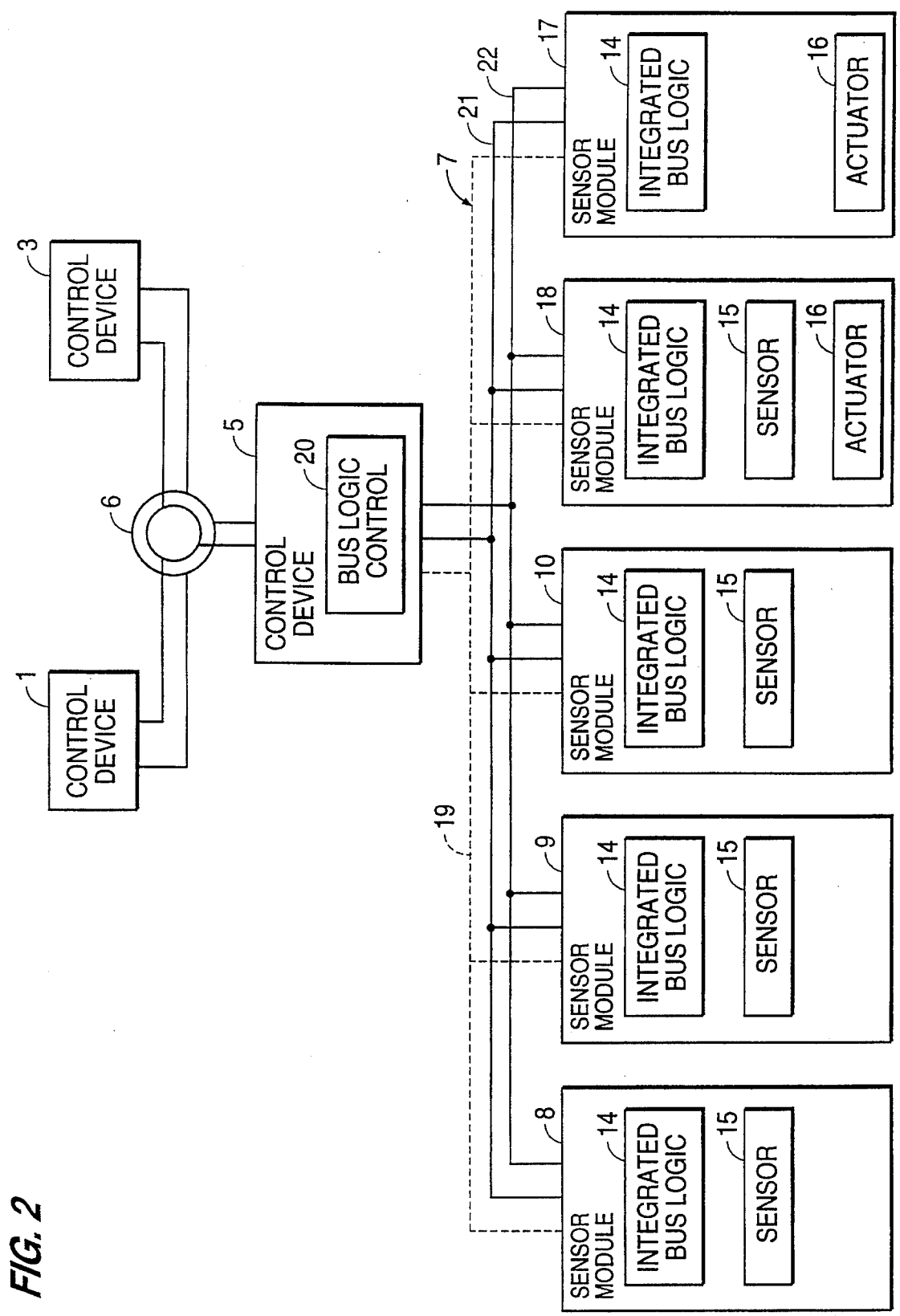
FIG. 2 shows a block circuit diagram of the bus system.

As can be seen from FIG. 2, the sensor modules 8, 9, 10 each consist of an integrated bus logic 14 and a sensor 15 organized in binary fashion. The sensor 15 thus has two states so that the sensor module 8, 9, 10 serves to detect binary switching signals. Instead of a sensor 15, the sensor module can also have an actuator 16 organized in binary fashion, as illustrated for a sensor module 17 in accordance with a further embodiment in FIG. 2, so that the sensor module 17 serves to process binary switching signals. In addition, it is also possible for the sensor module 18 to contain, in yet another embodiment, both a sensor 15 and an actuator 16. The sensor 15 which is organized in binary fashion can be for example a contact system such as an electrical switch, by means of which a binary switching signal can be produced. An example of an actuator 16 which is organized in binary fashion is a visual indicator means which makes a binary switching signal visible. The bus logic 14 consists of an electronic circuit which is located in the sensor module 8, 9, 10, 17, 18 and by means of which the respective sensor module 8, 9, 10, 17, 18 is connected to the bus 7. By means of the bus logic 14, the binary switching signals are converted into bus signals and transmitted to the bus 7. The bus signals can conversely also be received from the bus 7 by means of the bus logic 14, and converted into binary switching signals.

The bus 7 consists of a single, common data line 19 via which the sensor modules 8, 9, 10, 17, 18 are connected to one another, and is constructed for serial transmission of data. The sensor modules 8, 9, 10, 17, 18 are each connected to the power supply with a line 21 and to earth with a further line 22. When data security is a less important consideration, the data line 19 can also be formed by the line 21 for the power supply; however, a data line 19 which is separate from the line 21 for the supply voltage is preferred. The data line 19 is driven by the bus master device 5 which is independent of the main bus 6. For this purpose, a bus logic control 20 which can be for example a microprocessor or a signal processor, is arranged in the bus master device 5.

Each sensor module 8, 9, 10, 17, 18 in the bus system can be assigned an address by means of the bus logic 14. The bus master device 5 can produce bus signals in accordance with the address of the respective sensor module 8, 9, 10, 17, 18, so that the respective sensor module 8, 9, 10, 17, 18 can be addressed by the bus master device 5. In this way, the bus master device 5 can conversely also detect from which sensor module 8, 9, 10, 17, 18 data are transmitted. The priority of the sensor module 8, 9, 10, 17, 18 can be controlled via dynamic polling, i.e. a sensor module 8, 9, 10, 17, 18 with higher priority can be addressed repeatedly via the bus master device 5 in an interrogation cycle because of the direct addressability. Since the sensor modules 8, 9, 10, 17, 18 are reset after each interrogation with a reset instruction, non-defined states resulting from faults are excluded.

If an interruption occurs on the bus 7, the sensor modules 8, 9, 10, 17, 18 can be interrogated until the interruption by the bus master device 5. In the event of a short circuit, no sensor module 8, 9, 10, 17, 18 can be interrogated any longer but it is detected that a fault has occurred. If a specific signal is transmitted to the bus logic 14 by the bus master device 5, testing of the operational capacity of the bus logic 14, that is to say a self test, is triggered by the bus master device 5. A signal which corresponds to the result of this test is then transmitted back to the bus master device 5 so that the bus master device 5 can monitor the operational capacity of the entire bus 7. In the event of individual sensor modules 8, 9, 10, 17, 18 failing, a corresponding fault report can then be indicated.

Half duplex operation is used as transmission method, the bus 7 operating on the data line 19 bidirectionally both in the transmitting and in the receiving direction. During the transmission of the bus signals from the bus master device 5 to the sensor module 8, 9, 10, 17, 18 in the transmitting direction, a pulse/pause modulation takes place which is shown in greater detail in FIG. 3. When transmitting bus signals from the sensor module 8, 9, 10, 17, 18 to the bus master device 5 in the receiving direction load modulation takes place which is shown in greater detail in FIG. 4.

Figure 3:
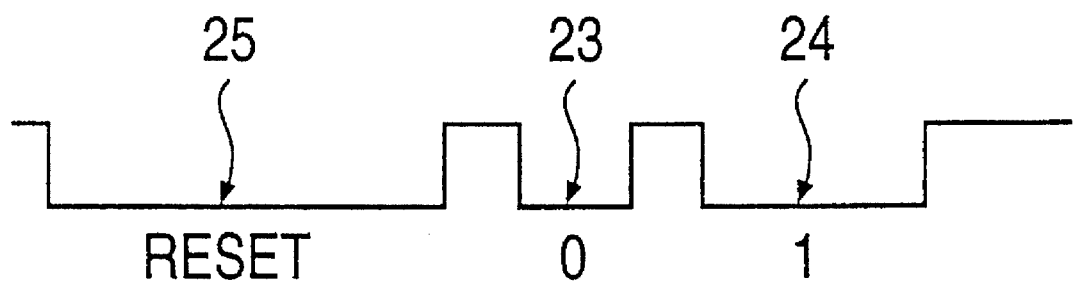
FIG. 3 shows bus signals during the transmission from the control device to the sensor module.
Figure 4:
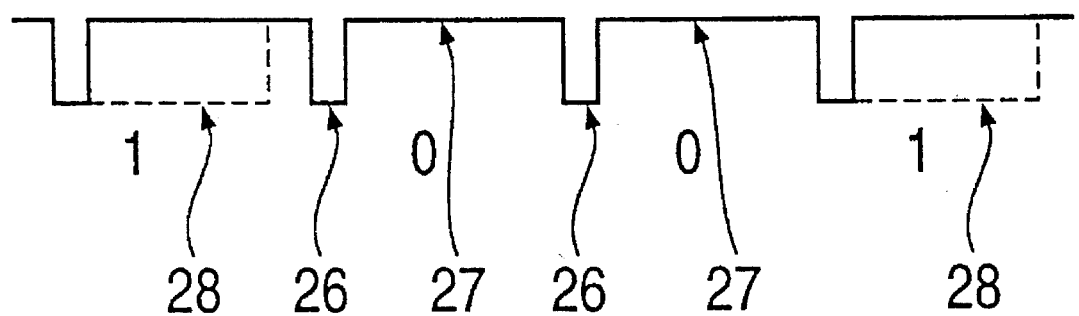
FIG. 4 shows bus signals during the transmission from the sensor module to the control device.

As can be seen from FIG. 3, the bus logic control 20 produces during the pulse/pause modulation in the bus master device 5 low signals 23, 24, 25 of different lengths. A short low signal 23 is interpreted by the bus logic 14, constituting the receiver, in the sensor module 8, 9, 10, 17, 18 as a logic zero, a long low signal 24 as a logic one. A low signal 25 which is even longer is interpreted by the bus logic 14 as a reset signal. When a reset signal of this kind occurs, the initial state of the bus logic 14 is set. The bus logic control 20 also assumes the control of the timing of the transmission during load modulation. As can be seen in FIG.

4, the bus logic control 20 switches in the bus master device 5 a sequence of high signals 27 and low signals 26 onto the data line 19, the high signal 27 being longer in terms of time. As a function of the data to be transmitted, the bus logic 14 can then either leave this high signal 27 at high or actively change it to low. While the bus logic control 20 sets the data line 19, said control 20 "observes" the latter and thus detects the level changes performed by the bus logic 14, which changes are entered as signals in FIG. 4 by dot dash lines. If a level change is performed by the bus logic 14 in accordance with signal 28, the bus logic control 20 interprets this as a logic one. If no level change is performed by the bus logic 14 so that the signal 27 remains unchanged, the bus logic control 20 interprets this as logic zero.

Figure 5:
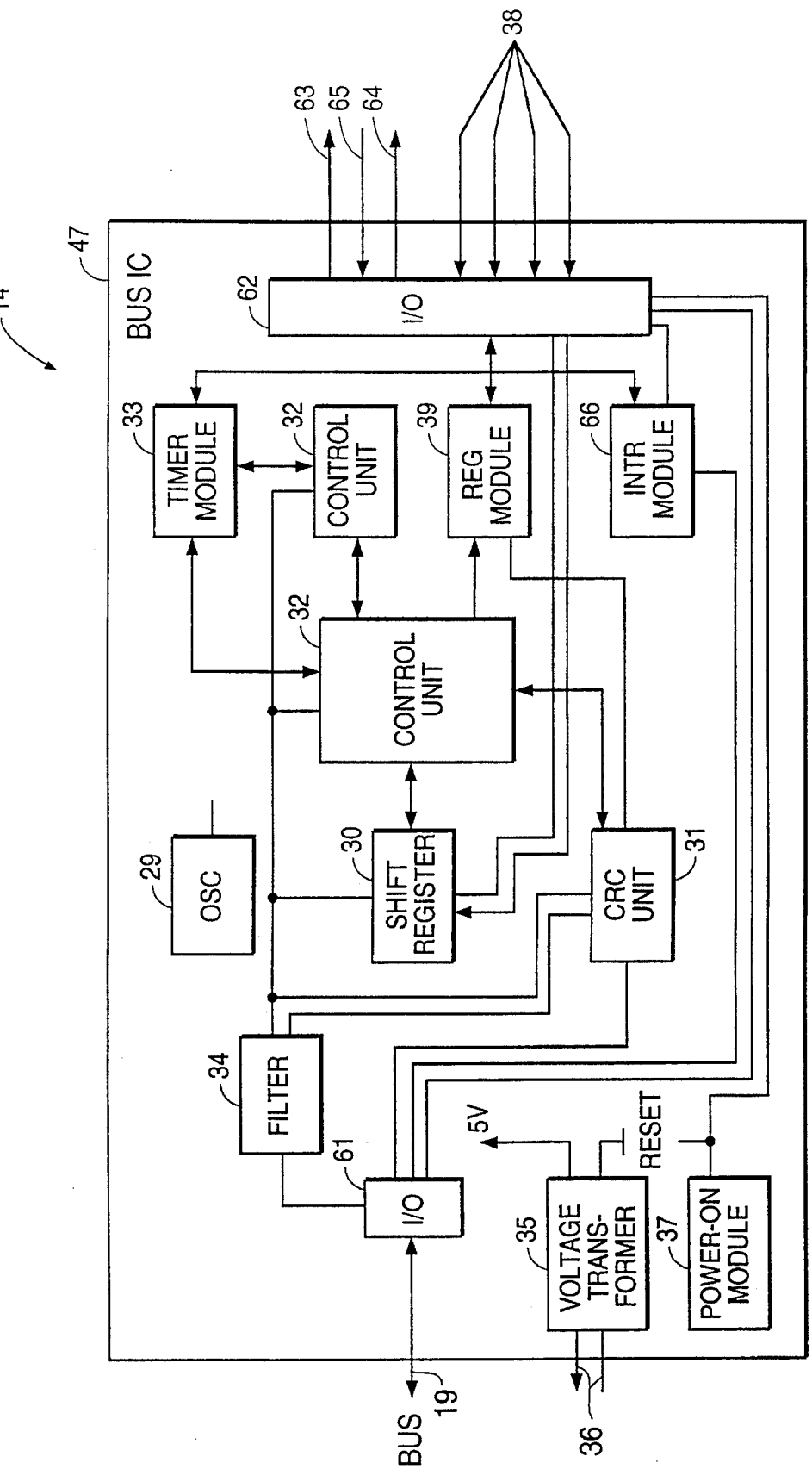
FIG. 5 shows a block circuit diagram indicating the structure of the bus logic.

The bus logic 14 located in the sensor module 8, 9, 10, 17, 18 is an electronic circuit whose structure can be seen in greater detail in a block circuit diagram according to FIG. 5. The bus logic 14 has an internal voltage transformer 35 which is connected via electronic feed lines 36 to the corresponding lines 21, 22 to supply the sensor module 8, 9, 10, 17, 18 with voltage. Since the supply voltage is tapped off from the automobile battery whose voltage is 12 V or 24 V, the voltage transformer 35 serves to convert the supply voltage to the size, for example 5 V, necessary for the bus logic 14. A power-on module 37 carries out an internal reset in the bus logic 14 automatically after switching on so that the bus logic 14 is placed in a defined initial state. An integrated oscillator 29 supplies the internal clock for the bus logic 14. The control of the operations in the bus logic 14 is effected by means of the control unit 32.

The bus signal which is transmitted by the bus master device 5 and received in an input/output module 61 via the data line 19 initially passes through a signal filter 34 which consists of a first and second counter. The bus logic 14 samples the data signal by means of the control unit 32 using the clock frequency generated in the oscillator 29. If the data signal is at low, the first counter in the signal filter 34 is increased by one. In this case, a low or high level is not evaluated by single sampling but rather by multiple sampling. In this method, brief faults do not affect the data signal. They only have a perceptible effect on the signal if they occur during sampling. After successful multiple sampling, the second counter in the signal filter 34 receives a reset signal, in response to which the second counter begins to count. As a function of the counting process of the second counter, the states zero or one in accordance with FIG. 3 are then detected by the said counter. When the second counter reaches its maximum state it resets the entire bus logic 14, which corresponds to the reset signal for the bus logic 14.

For the detection of a zero and a one, a range is thus defined in order to permit drift of the receiver frequency of the bus logic 14. These ranges, and the threshold between zero and one, are selected here to be such that a drift of the receiver frequency permits an equally large deviation from the nominal frequency for both types of data. In this way, faults on the data line 19 remain largely without influence. In comparison with conventional methods, this transmission method provides the advantage that the reception signal is not evaluated statically or in an edge-sensitive fashion but is rather sampled. Faults therefore only have perceptible effects if they occur during the moment of sampling. The counting process largely masks out faults during the sampling process. It is also advantageous that no fixed times are required, but rather a range of times is sufficient to detect a one or a zero. The method thus accepts frequency tolerances up to 100%.

The data signal produced from the bus signal in accordance with the second counter in the signal filter 34 is buffered in a shift register 30. By means of the data signal, an item of control data, the so-called cyclic redundancy check character (CRC), is formed by a CRC unit 31 in accordance with a fixed algorithm. This CRC is compared by means of the control unit 32 with the CRC received by the bus master device 5 so that transmission errors are discovered and the transmission of data can be repeated if necessary.

Address decoding in order to identify the receiver address provided by the bus master device 5 is also performed by means of the control unit 32 on the data signal located in the shift register 30. The address of the respective sensor module 8, 9, 10, 17, 18 is set for example by means of DIP switches and applied to address lines 38 whose signal can be passed on via an output/input module 62 into a register module 39. The control unit 32 can access the register module 39 in order to compare addresses. When the receiver address and the address of the sensor module correspond, the sensor 15 or the actuator 16 in the associated sensor module 8, 9, 10, 17, 18 is activated by the control unit 32. For this purpose, a sensor activation line 63 or an actuator activation line 64 is located at the output/input module 62.

If it is a sensor 15, the latter is activated for a specific period, for example 10 μs. The activation time is set by a timer module 33 which is also controlled by the internal oscillator 29. Then, the binary switching signal of the sensor 15, which signal corresponds to its status, is then loaded into the register module 39 via the status line 65 at the output/input module 62 after the transient period has been waited for, and is evaluated by the control unit 32. A data signal corresponding to the status of the sensor 15, a test flag and a CRC signal which is in turn formed by the CRC unit 31 are then made available by the control unit 32 in the shift register 30 and transmitted by the input/output module 61 to the bus master device 5 as bus signals via the data line 19, the signal transmission being controlled as load modulation according to FIG. 4 via the bus master device 5.

If there are no transmissions taking place on the bus 7, the bus master device 5 can switch into a standby mode with a low current drain. Then if the bus master device 5 does not transmit a signal to the bus logic 14 over a specific period, for example approximately 15 ms, the latter also switches automatically into a low-current drain interrupt mode. In this interrupt mode, the sensor 15 is activated by the control unit 32 at specific intervals, for example approximately 15 ms, brought about by the timer module 33, and the determined value is stored in the register module 39. If this value changes within two interrogations of the sensor 15, an interrupt is generated by the interrupt module 66 via the bus 7 and a corresponding signal transmission, controlled by the bus master device 5, to the bus master device 5 is triggered.

The circuit according to FIG. 5 for the bus logic 14 is preferably constructed using DMOS technology as a bus IC 47 (with respect to this see also FIG. 6) in the form of an integrated module on a chip. The chip can be essentially connected to the power supply for the electrical system of the motor vehicle without external components and no additional measures for isolating the electrical system of the vehicle from interference voltages are required. Such interference voltages can be voltage peaks up to approximately 100 V, so-called load dumps, brought about by the ignition. In this way, the highest possible degree of protection against EMC interference is achieved. Furthermore, the module can be realized with a small chip area. As a result of the small power drain of the chip and of the clocking of the actual sensor 15 by the bus logic 14 by means of the sensor activation line 63, the current consumption remains at a low level, for example below 500 μA.

Figure 6:
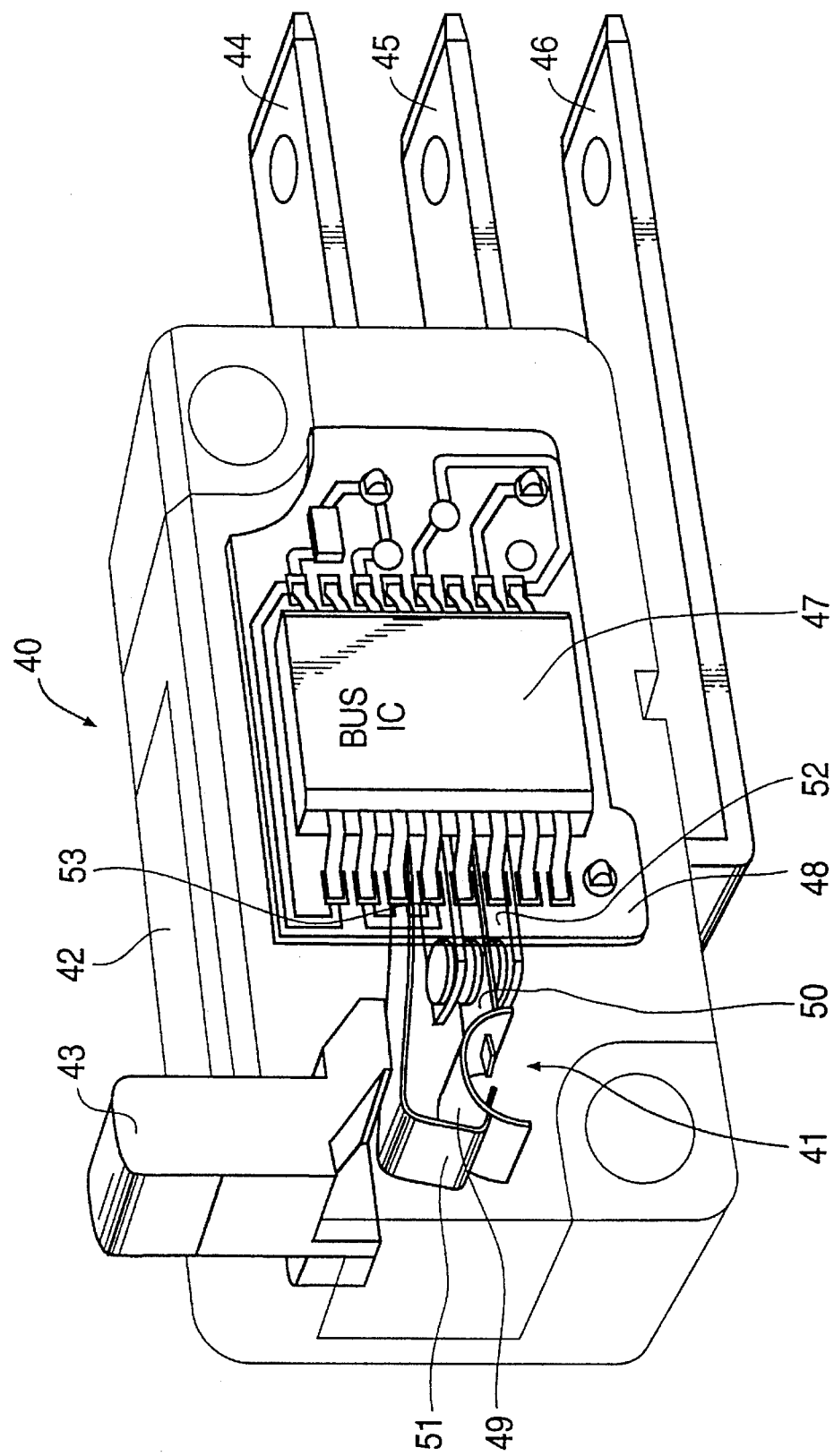
FIG. 6 shows a sensor module composed of a quick make-and-break switch and having a housing shown partially cut away and FIG. 7 shows a block circuit diagram for a sensor module with an inductive sensor.

The more detailed design of a sensor module 8, 9, 10 for detecting a binary switching signal can be seen in a first embodiment in FIG. 6. A mechanical switch 40 is used as sensor 15, by means of which an individual switch is designed which has an integrated sensor/bus logic and whose switching signal is passed on via the bus 7 directly to the bus master device 5 and, if appropriate, to the superordinate main bus 6. As a result, an individual switch of any desired type is designed as a "bus switch", i.e. the switching element is made capable of operation with a bus and is managed in a bus system.

The switch 40 has a contact system 41 which is arranged in a housing 42. The housing 42 has external dimensions which are comparable with a conventional microswitch. An actuation element 43 which acts on the contact system 41 so as to switch it is operatively connected to the contact system 41. In order to supply the contact system 41 with electrical voltage, two terminals 44, 45 with which the lines 21, 22 (shown in FIG. 2) are in electrical contact are located on the housing 42. A further terminal 46 which extends into the interior of the housing 42 serves to make the connection to the data line 19 for the bus 7 for the transmission of signals. The bus logic 14 is also arranged in the housing 42 as a chip in the form of a bus IC 47.

The bus IC 47 can be located on a printed circuit board 48. It is then suitable to arrange the contact system 41 in the housing 42 in such a way that it is connected to the printed circuit board 48. With the terminals 44, 45, 46 extending into the housing 42, the printed circuit board 48 is connected, the terminals 44, 45 serving for the power supply of the contact system 41 and the terminal 46 for the data line 19.

The contact system 41 of the switch 40 is a mechanically acting contact system which is constructed as a quick make-and-break switch system with a switching contact 50 and at least one, preferably two, fixed contacts 52, 53. A scroll spring 49 is fitted between the movable switching contact 50 and a spring lever 51 which is in turn operatively connected to the actuation element 43. In the non-actuated state, the switching contact 50 rests against the fixed contact 53. Under the action of force on the actuation element 43, the spring lever 51 is moved, the switching contact 50 snapping over and coming to rest against the fixed contact 52. The binary switching signals thus constitute the respective switching state of the contact system 41, namely a first state in which the switching contact 50 rests against the fixed contact 53 and a second state in which the switching contact 50 rests against the fixed contact 52.

Figure 7:
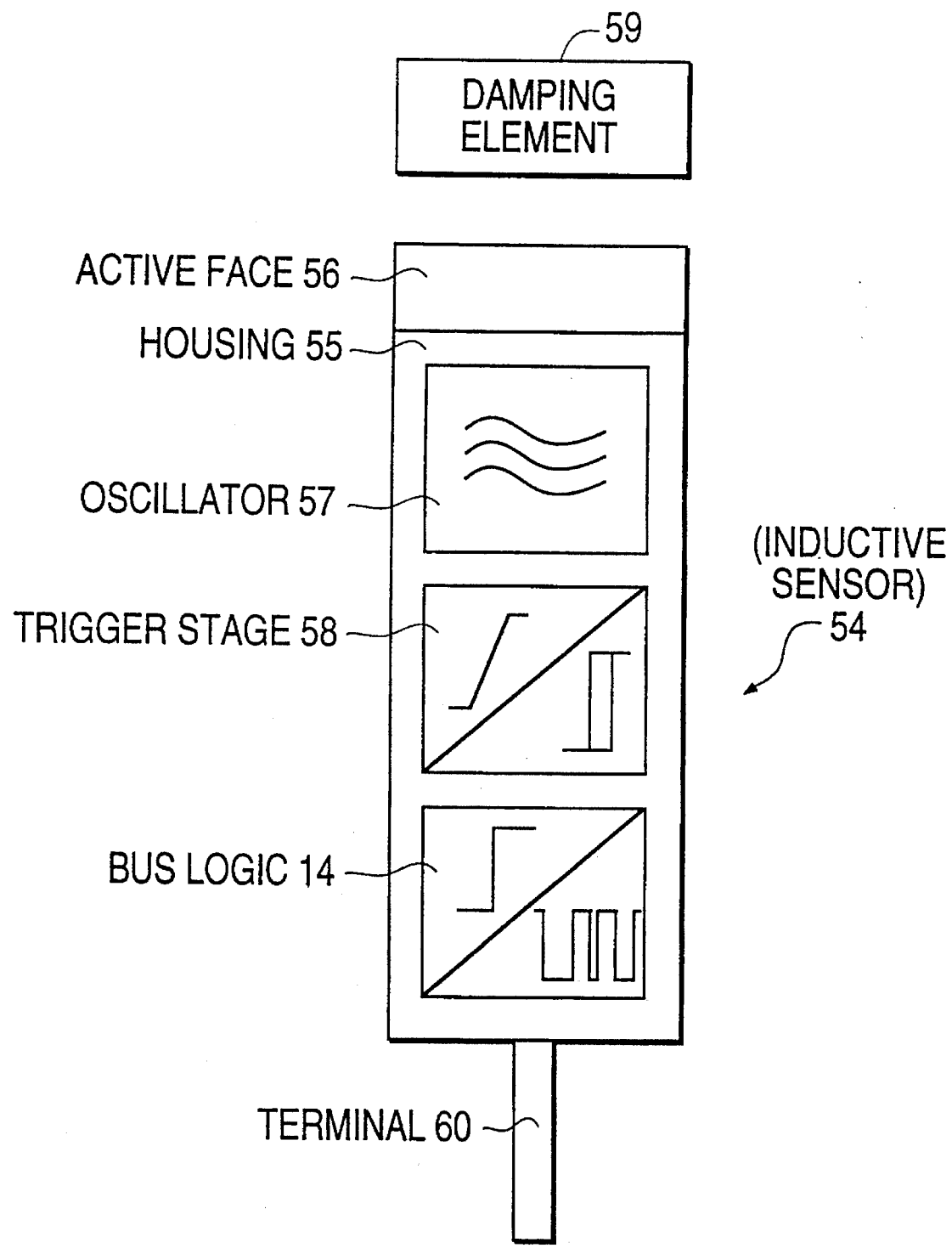

Instead of a switch 40 of this kind in which a mechanical contact system 41 is used as sensor 15, the contact system can also be constructed as a sensor 15 with a different principle of operation. The principles of operation selected for the sensor 15 can be for example based on the Hall effect, be magnetic or inductive, capacitive, magnetor-restrictive or optical and the like. In FIG. 7, a sensor module 8, 9, 10 is shown as a further exemplary embodiment in the form of an inductive sensor 54 in a diagrammatic view in a block circuit diagram.

The inductive sensor 54 has a housing 55 with an active face 56 located on the end side. An oscillator 57, a trigger stage 58 and the bus logic 14 are arranged in the housing 55. A movable damping element 59, for example an electrically conductive metal, is located as actuation element in the vicinity of the active face 56. A terminal 60, connected to the bus logic 14, for the data line 19 leads into the housing 55. The terminals for the supply voltage of the inductive sensor 54 are omitted for the sake of clarity.

If a bus signal with the address associated with the inductive sensor 54 is transmitted by the bus master device 5 via the bus 7, the bus logic 14 activates the oscillator 57. By means of an oscillating circuit coil, the said oscillator produces an electromagnetic alternating field which emerges from the active face 56 of the inductive sensor 54. If the damping element 59 approaches the active face 56, eddy currents which draw energy from the oscillator 57 are induced in the damping element 59. As a result, a level change is achieved which causes the trigger stage 58 to change state. The output signal of the trigger stage 58 is detected by the bus logic 14 and, on request, bus signals corresponding to the status of the inductive sensor 54 are then transmitted to the bus master device 5.

The invention is not restricted to the exemplary embodiments described and illustrated. Rather, it also includes all expert further developments within the scope of the inventive idea. Thus, the bus system and the sensor modules connected thereto can not only be used in motor vehicles. It is conceivable also to use them in machine tools, where for example the position interrogation of an actuator can take place in a hydraulic cylinder or the limit position of a workpiece carriage can be determined. The invention can also be used in a versatile way in measuring devices, process control devices and the like and for display elements and motor drivers.

1 Control device for the engine electronics
2 Engine compartment
3 Switching device for control switches
4 Car door
5 Control device for window lifters and rear view mirror adjustment
6 Main bus
7 Bus
8 Sensor module for rear view mirror adjustment
9 Sensor module for central locking
10 Sensor module for window lifters
11 Rear view mirror
12 Window
13 Door lock
14 Bus logic
15 Sensor
16 Actuator
17, 18: Sensor module (other embodiment)
19 Data line
20 Bus logic control (in bus master device)
21 Line for the power supply
22 Line for the earth
23 Short low signal (zero)
24 Long low signal (one)
25 Still longer low signal (reset)
26 Low signal
27 High signal
28 Signal (change in load modulation)
29 Oscillator
30 Shift register
31 CRC unit
32 Control unit
33 Timer module
34 Signal filter
35 Internal voltage transformer
36 Electrical feed line
37 Power-on module
38 Address line 39 Register module
40 Mechanical switch
41 Contact system
42 Housing
43 Actuation element
44, 45 Terminal (for electrical voltage)
46 Terminal (for data line)
47 Bus IC
48 Printed circuit board
49 Scroll spring
50 Switching contact
51 Spring lever
52, 53 Fixed contact
53 Inductive sensor
54 Housing
55 Active face
56 Oscillator
57 Trigger stage
58 Damping element
59 Terminal (for data line)
60 Input/output module
61 Output/input module
62 Sensor activation line
63 Actuator activation line
64 Status line
65 Interrupt module

What is claimed is:

1. A bus system for a plurality of sensor modules, comprising:

at least one bus for interconnecting the plurality of sensor modules and for carrying signals between the plurality of sensor modules;

switching control devices, a first one of the switching control devices being a bus master device for the at least one bus and having bus logic control for controlling the transmission of signals over the at least one bus;

a superordinate main bus for connecting the switching control devices together and for transmitting signals between the switching control devices, the at least one bus being thereby connected with the superordinate main bus by the first one of the switching control devices which is the bus master device for the at least one bus;

wherein binary switching signals transmitted over the at least one bus are at least one of:
(a) detected by the sensor modules, and
(b) processed by the sensor modules;

wherein the sensor modules contain integrated bus logic for converting the binary switching signals into bus signals and for converting bus signals into binary switching signals;

wherein the at least one bus has a single common data line to which the sensor modules are connected for serial data transmission;

wherein the at least one bus operates bidirectionally in transmitting and receiving directions during half-duplex operation;

wherein the single common data line is driven by the first one of the switching control devices which acts as the bus master device, independently of the superordinate main bus;

wherein the bus logic control in the first one of the switching control devices which acts as the bus master device controls the timing of data transmission in both transmitting and receiving directions; and wherein the at least one bus provides a supply voltage to the sensor modules.

2. The bus system as claimed in claim 1, wherein the sensor modules operate in a binary fashion having two states, and comprise at least one of:
(1) a sensor, and
(2) an actuator.

3. The bus system as claimed in claim 2, wherein at least one of the sensor modules is a visual indicator means.

4. The bus system as claimed in claim 2, wherein at least one of the sensor modules comprises a contact system.

5. The bus system as claimed in claim 4, wherein the binary switching signals are signals which correspond to respective switching states of the contact system.

6. The bus system as claimed in claim 5, wherein said at least one of the sensor modules comprising the contact system further comprises:

a housing in which the contact system and the integrated bus logic are disposed, an actuation element, operatively connected to the contact system and disposed in the housing, for switching the contact system, and a first electrical terminal, which extends into the housing, the first electrical terminal being connected to the at least one bus and the integrated bus logic.

7. The bus system as claimed in claim 6, wherein circuitry of the integrated bus logic is disposed on a printed circuit board disposed in the housing.

8. The bus system as claimed in claim 7, wherein the contact system is connected to the printed circuit board.

9. The bus system as claimed in claim 7, wherein the first electrical terminal is for the data line and is connected to the printed circuit board;

wherein second and third electrical terminals are provided extending into the housing and connected to the printed circuit board.

10. The bus system as claimed in claim 4, wherein the contact system is a mechanical contact system.

11. The bus system as claimed in claim 10, wherein the contact system comprises a quick make-and-break switch system including:

a movable switching contact;

at least one fixed contact;

a spring lever;

a scroll spring fitted between the switching contact and the spring lever; and an actuation element operatively connected to the spring lever.

12. The bus system as claimed in claim 11, wherein the contact system includes a housing and is in the form and shape of a microswitch.

13. The bus system as claimed in claim 4, wherein the contact system is a contact system selected from the group consisting of:

an inductively operated contact system;

a capacitively operated contact system;

a magneto-restrictively operated contact system;

an optically operated contact system; and a magnetically operated contact system operated by the Hall effect.

14. The bus system as claimed in claim 13, wherein at least one sensor module comprises an inductive sensor including an oscillator connected to an oscillating circuit coil, a trigger stage, and a damping element, which serves as an actuation element;

wherein the integrated bus logic, the oscillator, the oscillating circuit coil and the trigger stage are arranged in a housing having an active face; and wherein an alternating field is produced by the oscillating circuit coil and emerges from the housing through the active face thereof, whereby the damping element moves into the vicinity of the active face.

15. The bus system as claimed in claim 1, wherein circuitry of the integrated bus logic comprises a bus IC module.

16. The bus system as claimed in claim 15, wherein the bus IC module is formed with DMOS technology.

17. The bus system as claimed in claim 1, wherein the data line also provides the supply voltage to at least one of the sensor modules.

18. The bus system as claimed in claim 1, wherein the data line is a separate line from the supply voltage and leads to at least one of the sensor modules.

19. The bus system as claimed in claim 1, wherein the bus signals are transmitted from the bus master device to at least one of the sensor modules using pulse/pause modulation, and wherein the bus signals are transmitted from at least one of the sensor modules to the bus master device using load modulation.

20. The bus system as claimed in claim 19, wherein, during the pulse/pause modulation, the bus master device produces low signals of three different lengths:

(1) a shortest length low signal representing logic zero;
(2) a medium length low signal representing logic one; and
(3) a long low signal representing a reset by the integrated bus logic of the sensor module.

21. The bus system as claimed in claim 19, wherein, during load modulation, the bus master device produces a sequence of high-low-high levels on the data line the high level being at high for a relatively long time;

wherein the integrated bus logic of the sensor module leaves the bus signal at high as a function of the data to be transmitted or actively moves it to low; and wherein the bus master device evaluates signal level changes performed by the integrated bus logic.

22. The bus system as claimed in claim 19, wherein the integrated bus logic samples the bus signal with a specific clock frequency and evaluates low and high levels by repeated sampling.

23. The bus system as claimed in claim 1, wherein the integrated bus logic assigns an address to the sensor module, and wherein bus signals are produced in accordance with the address of the sensor module.

24. The bus system as claimed in claim 1, wherein a bus signal triggers the integrated bus logic to perform self-testing of the operational capacity of the integrated bus logic.

* * * * *